United States Patent [19]
Funaki et al.

[11] Patent Number: 5,548,151
[45] Date of Patent: Aug. 20, 1996

[54] HALL ELEMENT FOR DETECTING A MAGNETIC FIELD PERPENDICULAR TO A SUBSTRATE

[75] Inventors: Hideyuki Funaki; Hiroshi Mochizuki, both of Tokyo; Ryoji Maruyama; Kanae Fujii, both of Kanagawa-ken, all of Japan

[73] Assignee: Kabushiki Kaisha Toshiba, Kanagawa-ken, Japan

[21] Appl. No.: 385,058

[22] Filed: Feb. 7, 1995

[30] Foreign Application Priority Data

Mar. 9, 1994 [JP] Japan ................................. 6-038667
Mar. 9, 1994 [JP] Japan ................................. 6-038668

[51] Int. Cl.⁶ ........................................... H01L 29/82
[52] U.S. Cl. ........................ 257/421; 257/427; 257/515
[58] Field of Search ............................... 257/421, 426, 257/427, 507, 515, 773

[56] References Cited

U.S. PATENT DOCUMENTS 4,782,375  11/1988  Popovic ................................. 257/426
4,987,467  1/1991   Popovic ................................. 257/427

FOREIGN PATENT DOCUMENTS

0148330A3  7/1985   European Pat. Off. ........ H01L 43/06
0204135A1  12/1986  European Pat. Off. ........ H01L 43/06

OTHER PUBLICATIONS

Wolfrum, "KSY 14—the Ultra-flat, Versatile Hall Sensor," Siemens Components XXV, Oct. 25, 1990, No. 5, pp. 167–172.

*Primary Examiner*—Mark V. Prenty
*Attorney, Agent, or Firm*—Finnegan, Henderson, Farabow, Garrett & Dunner, L.L.P.

[57] ABSTRACT

In a Hall element, a semiconductor layer is surrounded by a first trench filled with an insulator. A first current supply portion of an n+-type semiconductor is disposed adjacent the semiconductor layer and the first trench. Second current supply portions are also disposed adjacent the semiconductor layer and the first trench and symmetrical with respect to the first current supply portion. Sensor portions of an n+-type semiconductor are disposed adjacent the semiconductor layer and the first trench at about the center between the first and second current supply portions, respectively. A magnetic flux perpendicular to the upper surface of the semiconductor layer can be detected by the foregoing arrangement.

23 Claims, 11 Drawing Sheets

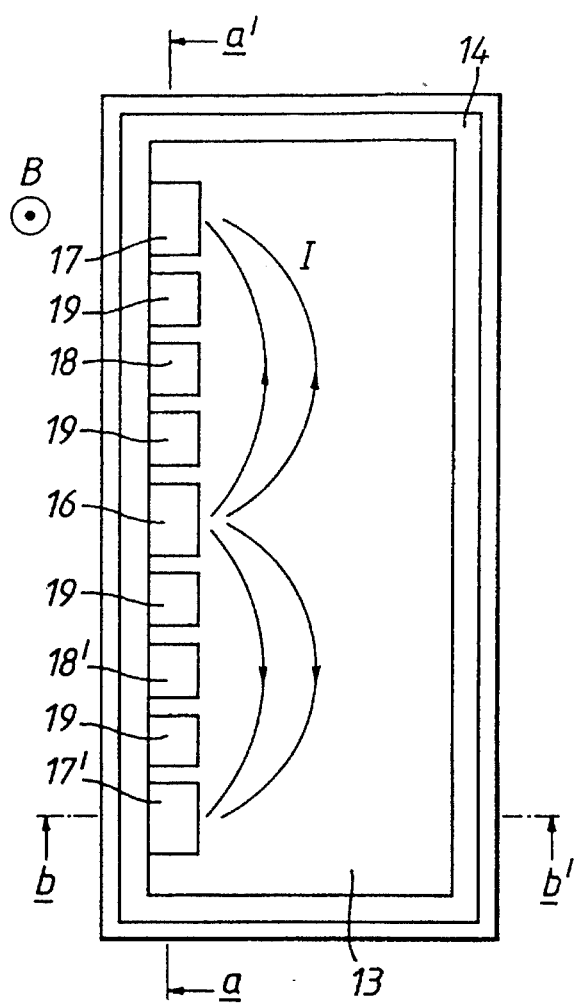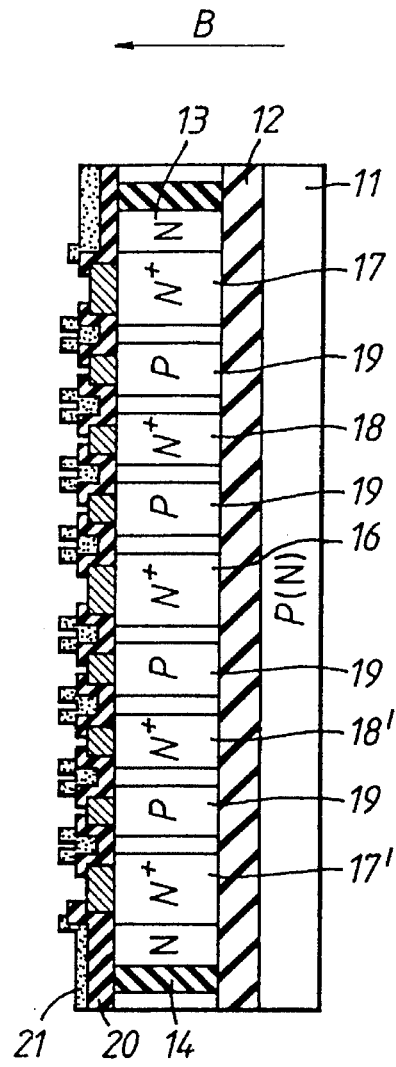
Fig.3(a)  Fig.3(b)
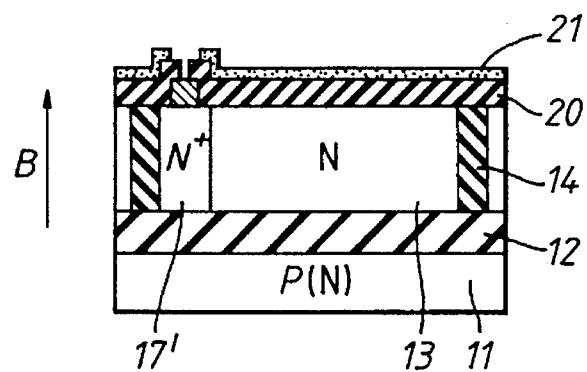
Fig.3(c)

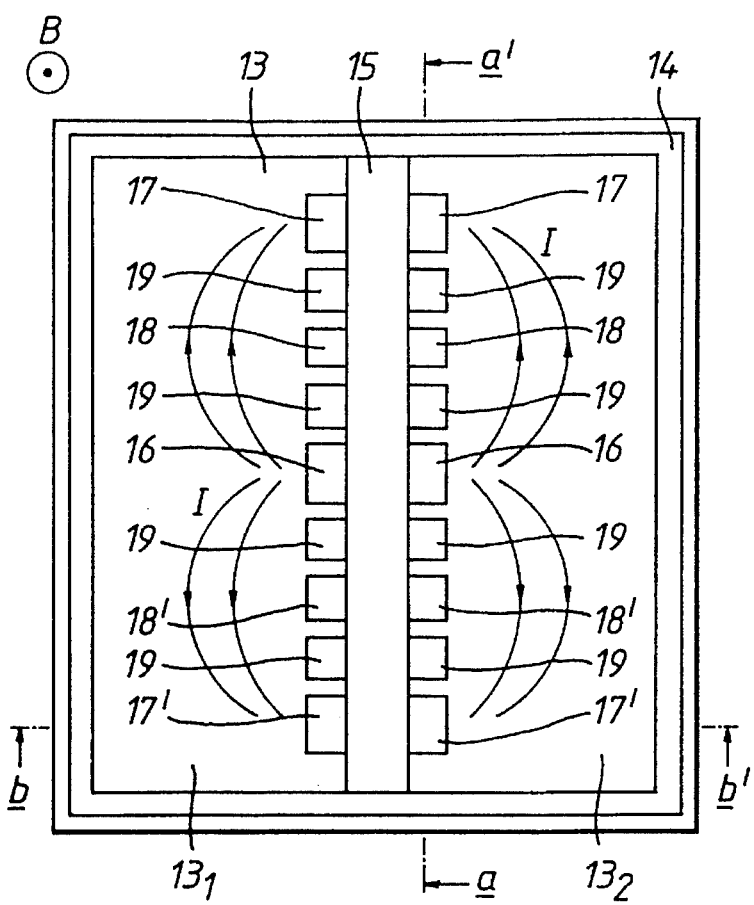
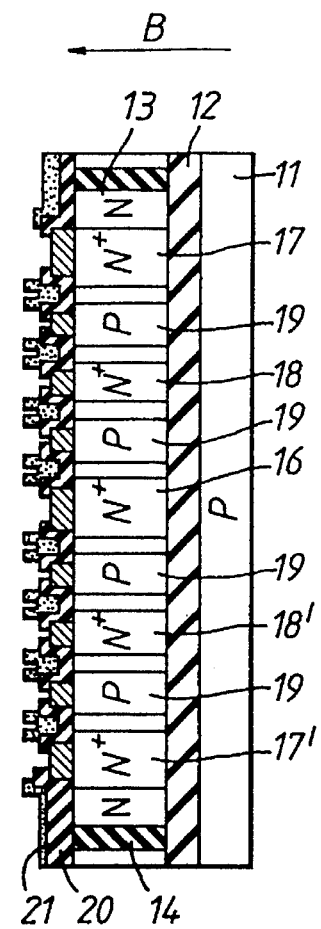
Fig.7(a)    Fig.7(b)
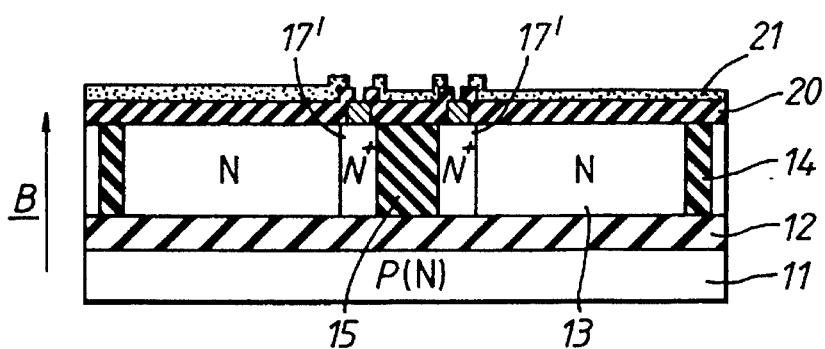
Fig.7(c)

HALL ELEMENT FOR DETECTING A MAGNETIC FIELD PERPENDICULAR TO A SUBSTRATE

BACKGROUND OF THE INVENTION

1. Field of the Invention

The present invention relates to a Hall element for detecting a magnetic field. More particularly, the present invention relates to a planar Hall element having electrodes formed on a surface of the device and being capable of detecting a magnetic field in a direction perpendicular to that surface.

2. Description of the Prior Art

A Hall element can be used as a magnetic field sensor. Since current causes a magnetic field, a Hall element can also be used as a current detector, which, for example, might be applied in an electricity counter.

FIG. 1 is a view of a Hall element. In the Hall element, current supply electrodes C1 and C2 are positioned on opposite sides of a semiconductor substrate 1. Sensor electrodes S1 and S2 are positioned on the other opposite sides. A magnetic field is applied in a direction perpendicular to FIG. 1 (i.e., into the paper on which FIG. 1 is printed, as is represented by arrow B).

When a current flows between current supply electrodes C1 and C2 with a magnetic flux, an electromotive force, i.e., a Hall voltage, occurs between sensor electrodes S1 and S2. Assuming that the current has a current density J, and the magnetic flux has a magnetic flux density B, and further assuming that an x-axis exists in the direction from current supply electrode C1 to current supply electrode C2, a y-axis exists in the direction from sensor electrode S1 to sensor electrode S2, $E_y = R_H \times J_x \times B_z$ will be satisfied, where $E_y$ is a y-axis component of an electric field, $J_x$ is an x-axis component of current density J, $B_z$ is a z-axis component of magnetic flux density B, and $R_H$ is a Hall coefficient.

In the Hall element of FIG. 1, L represents the distance between current supply electrodes C1 and C2, and W represents the distance between sensor electrodes S1 and S2. The rate of L/W must be large to obtain a large Hall voltage.

U.S. Pat. Nos. 4,782,375 and 4,987,467 disclose Hall elements whose electrodes C1, C2, S1 and S2 are situated on a surface of a semiconductor substrate 1, i.e., a planar type semiconductor device. FIG. 2 shows a typical Hall element of the type disclosed in the aforementioned patents. In FIG. 2, current supply electrode C1 is positioned at a central location between current supply electrodes C2. Sensor electrodes S1 and S2 are positioned between current supply electrodes C1 and C2. Since a current I between current supply electrodes C1 and C2 has a current component perpendicular to substrate 1, the Hall element of FIG. 2 detects a magnetic field parallel to the surface of substrate 1.

The dimensions L and W from FIG. 1 are also shown in FIG. 2. In FIG. 2, W substantially corresponds to the width of current supply electrode C1, and L substantially corresponds to the distance between current supply electrodes C1 and C2. The Hall element shown in FIG. 2 requires a large current component perpendicular to substrate 1. Therefore, the width of current supply electrode C1 must be large which, in turn, increases the size of W. This means that L must also be large to ensure that L/W will remain satisfactorily large. The overall result is that the size of the Hall element shown in FIG. 2 is large.

An offset voltage, which would exist without any magnetic field, is another problem. An offset voltage is sometimes caused by the asymmetrical placement of electrodes C2, S1, S2 with respect to electrode C1. Also, an offset voltage is sometimes caused by stress, since the mobilities of carriers may change due to the piezo effect and, also, the amount of piezo effect is different depending upon the crystal direction. For example, piezoresistances change at a 90° period in the <100> plane of silicon (Si). The current shown in FIG. 2 has a component flowing close to the surface of substrate 1. Since stress is large at that surface, the offset voltage problem still remains.

A Hall element may be positioned within a gap in a yoke wound by a wire carrying an object current to detect a magnetic field. This gap must be narrow, because a magnetic field applied to a Hall element is in inverse proportion to the distance of the gap. However, since the magnetic field direction in the Hall element shown in FIG. 2 is parallel with respect to the substrate, the gap will be unavoidably large in the case where such a Hall element is inserted in the gap.

As can be understood from the above, the sensitivity of a current detector using a planar type Hall element is not sufficient.

SUMMARY OF THE INVENTION

Accordingly, one object of this invention is to provide a Hall element which is a planar type semiconductor device that can detect a magnetic field perpendicular to a substrate. Another object of this invention is to provide a Hall element with a reduced offset voltage.

To achieve the objects and in accordance with the purpose of the invention, as embodied and broadly described herein, the present invention provides a Hall element of a planar type semiconductor device, i.e., a semiconductor device of which all electrodes are placed on one surface of the device, comprising: a semiconductor layer of a first conductivity type; first and second current supply portions of the first conductivity type disposed on a surface of the semiconductor layer so as to make a current flow in a direction parallel to the semiconductor layer between the first and second current supply portions; and sensor portions of the first conductivity type disposed on the surface so that a Hall voltage is induced with magnetic flux perpendicular to the semiconductor layer during current flowing between the first and second current supply portions.

The Hall element according to the present invention can be applied to a current detector comprising a magnetic yoke having a gap within which the Hall element of the present invention is disposed, with a wire carrying an object current and winding around the magnetic yoke.

The semiconductor layer could provide an insulator layer on a bottom surface, which the insulator portion preferably reaches. Also, the first and second current supply portions and sensor portions preferably reach the insulator layer.

A Hall element according to the present invention could provide a gate insulator layer disposed on the surface of the semiconductor layer; and a gate electrode disposed on the gate insulator layer, so that current can flow away from the surface by forming a depletion layer, an accumulation layer, or an inversion layer under the gate insulator layer. Also, a Hall element according to the present invention could provide a second conductivity type semiconductor layer disposed on the semiconductor layer for the same effect.

Further, a Hall element according to the present invention could provide a current path control means, e.g., a second type semiconductor layer or an insulated gate electrode, to increase the length of the current path between the first and second current supply portions.

In the present invention, the semiconductor layer may be formed on a substrate having an insulator surface, e.g., SOI (silicon on insulator), or may be formed on a semiconductor substrate of a second conductivity type. The SOI is effective to reduce the effect of substrate electric potential to a Hall voltage.

The semiconductor layer preferably has a thickness of from about 5 μm to about 10 μm, and a carrier concentration of from about $10^{15} cm^{-3}$ to about $10^{16} cm^{-3}$, so as to obtain high sensitivity.

The present invention further provides a Hall element comprising: a semiconductor layer of a first conductivity type; and an insulator portion disposed on the semiconductor layer so as to divide the semiconductor layer into first and second current paths and to maintain a Hall current path between the first and second current paths, wherein the first and second current paths are substantially parallel in the surface so that a Hall current flows between the first and second current paths through the Hall current path when a magnetic field is applied in a direction perpendicular to the surface during current flowing along the first and second current paths.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings:

FIG. 3(a) is a plan view of a Hall element in accordance with an embodiment of the present invention;

FIGS. 3(b) and 3(c) are sectional views of the Hall element depicted in FIG. 3(a);

FIG. 7(a) is a plan view of a all element in accordance with yet another embodiment of the present invention;

FIGS. 7(b) and 7(c) are sectional views of the Hall element depicted in FIG. 7(a);

DETAILED DESCRIPTION OF THE PREFERRED EMBODIMENTS

EXAMPLE 1

Figure 1:
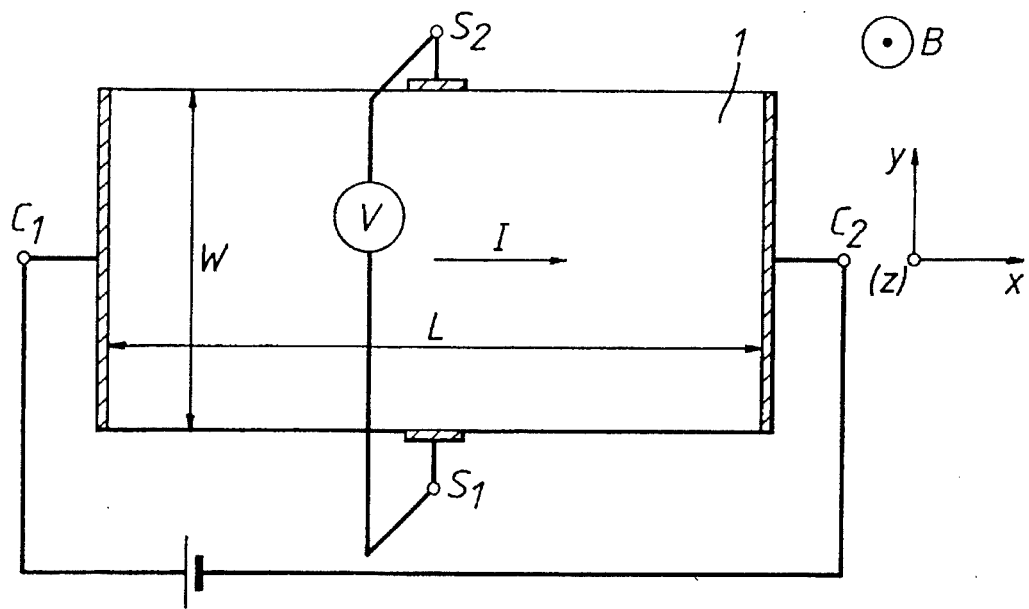
FIG. 1 is a view of a Hall element.
Figure 2:
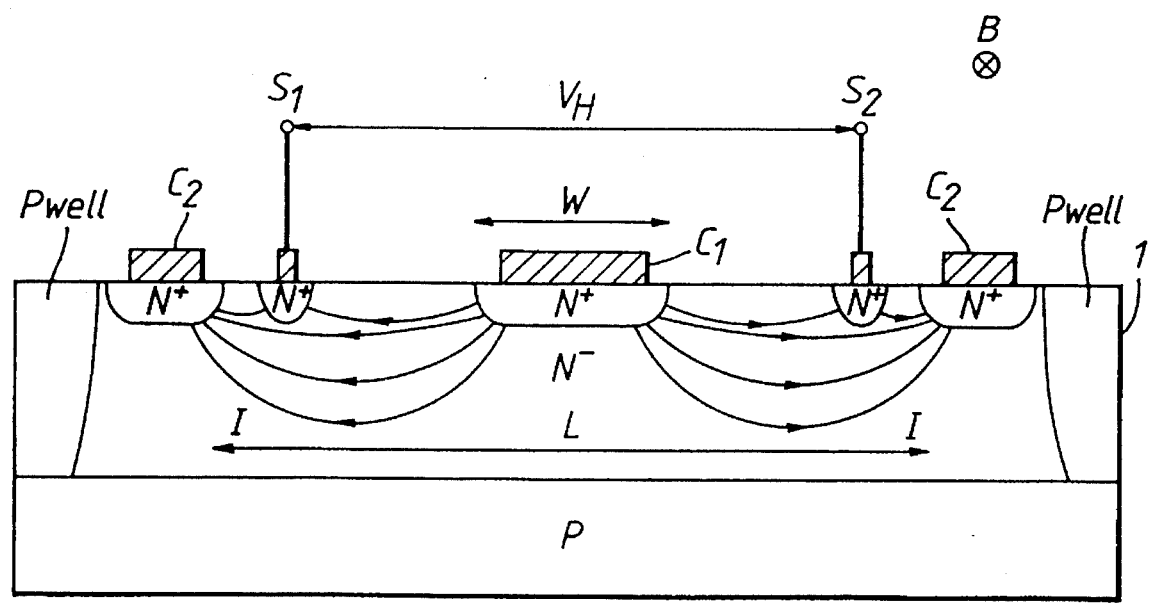
FIG. 2 is a sectional view of a conventional Hall element.

FIG. 3(a) is a plan view of a Hall element in accordance with an embodiment of the present invention. FIG. 3(b) is a sectional view taken along line a—a' of FIG. 3(a), and FIG. 3(c) is a sectional view taken along line b—b' of FIG. 3(a).

With reference to FIGS. 3(a), 3(b), and 3(c), a semiconductor layer 13 of a first semiconductor type (an n-type semiconductor, for example) is formed on an insulator layer 12 disposed on a semiconductor substrate 11. For example, an SOI (silicon on insulator) substrate can be used. Semiconductor layer 13 is surrounded by a first trench 14 filled with an insulator to form an insulator portion.

As best seen from FIG. 3(a), portions of semiconductor layer 13 intermittently abut the inside surface of the leftward wall of first trench 14. A first current supply portion 16 of an n+-type semiconductor (e.g., at least $10^{19} cm^{-3}$) is disposed between two of the intermittently abutting portions of semiconductor layer 13 and in contact with the inside surface of the leftward wall of first trench 14. First current supply portion 16 reaches insulator layer 12.

Second current supply portions 17, 17' are disposed between two of the intermittently abutting portions of semiconductor layer 13 and in contact with the inside surface of the leftward wall of first trench 14. Each second current supply portion 17, 17' is located so as to be symmetrical with respect to first current supply portion 16. In other words, first and second current supply portions 16, 17, 17', are arranged in a line and first current supply portion 16 is placed at the center between second current supply portions 17, 17'. Second current supply portions 17, 17' also reach insulator layer 12.

Further, sensor portions 18, 18' of an n+-type semiconductor (e.g., at least $10^{19} cm^{-3}$) are disposed between two of the intermittently abutting portions of semiconductor layer 13 and in contact with the inside surface of the leftward wall of first trench 14. Sensor portions 18, 18' are positioned at or near the center between first and second current supply portions 16, 17, and 17'. Sensor portions 18, 18' also reach insulator layer 12.

Further, current path control portions 19 of a second semiconductor type (a p-type semiconductor of at least $10^{17} cm^{-3}$, for example) are disposed between two of the intermittently abutting portions of semiconductor layer 13 and in contact with the inside surface of the leftward wall of first trench 14. Current path control portions 19 are positioned between first current supply portion 16 and sensor portions 18, 18', and between second current portions 17, 17' and sensor portions 18, 18', respectively. Current path control portions 19 also reach insulator layer 12.

The upper surface of semiconductor layer 13 is covered with a second insulator layer 20 having a thickness, for example, of hundreds of angstrems. Second insulator layer 20, in turn, is covered with a gate electrode 21. Second insulator layer 20 and gate electrode 21 are shown in FIGS. 3(*b*) and 3(*c*), but not in FIG. 3(*a*). As can be understood from FIGS. 3(*a*), 3(*b*), and 3(*c*), and from the description above, first and second current supply portions 16, 17, 17', sensor portions 18, 18', and current path control portions 19 are arranged in a line along first trench 14.

Second insulator layer 20 has holes corresponding to first current supply portions 16, second current supply portions 17, 17', sensor portions 18, 18', and current path control portions 19. An electrode is formed in each of the holes. The Hall element in the embodiment of FIGS. 3(*a*), 3(*b*), and 3(*c*) may be produced using ordinary planar techniques designed for integrated circuits, e.g., diffusion, etching, deposition, oxidation, and the like.

In the embodiment of FIGS. 3(*a*), 3(*b*) and 3(*c*), since first and second current supply portions 16, 17, 17' are adjacent to first trench 14, a current I between first and second current supply portions 16, 17, 17' has a current component perpendicular to a plane corresponding to the inside surface of the leftward wall of first trench 14. Further, the current I between first and second current supply portions 16, 17, 17' is asymmetrical with respect to that plane causing magnetic flux perpendicular with respect to the upper surface of semiconductor layer 13. As a result, magnetic flux perpendicular to the upper surface of semiconductor layer 13 can be detected, i.e., when magnetic flux B is applied in a direction perpendicular with respect to a plane of semiconductor layer 13 (the plane including the upper surface of semiconductor layer 13, for example), a Hall voltage is induced between sensor portions 18, 18'.

If first trench 14 were not provided, current I would flow symmetrically on both sides of the line in which first and second current supply portions 16, 17, 17' are arranged. Consequently, the Hall voltage due to the current on the left side of the line would counterbalance the Hall voltage due to the current on the right side of the line. As a result, if first trench 14 were not provided, a Hall voltage would not be induced by a magnetic field perpendicular to the upper surface of semiconductor layer 13.

In accordance with the embodiment depicted in FIGS. 3(*a*), 3(*b*), and 3(*c*), the current I between first and second current supply portions 16, 17, 17' must be asymmetrical with respect to the plane corresponding to the line in which current supply portions 16, 17, 17' are arranged, with magnetic flux perpendicular with respect to the upper surface of semiconductor layer 13. Therefore, it is not necessarily required that portions 16, 17, 17' must contact first trench 14. However, since the Hall voltage would become smaller with an increase in distance between portions 16, 17, 17' and first trench 14, portions 16, 17, 17' are preferably disposed in contact with first trench 14 in the manner depicted in FIGS. 3(*a*), 3(*b*), and 3(*c*).

Since the position of sensor portions 18, 18' can be arranged so as to detect a Hall voltage, it is not necessary for these portions to be adjacent to first trench 14 and at a central position between first and second current supply portions 16, 17, 17'. However, if the distance between first current supply portion 16 and sensor portion 18 is different from the distance between first current supply portion 16 and sensor portion 18', an offset voltage may exist. Further, when sensor portions 18, 18' are placed near the center between first and second current supply portions 16, 17, 17', the Hall voltage is at a maximum. Therefore, sensor portions 18, 18' are also preferably arranged in contact with first trench 14 in the manner depicted in FIGS. 3(*a*), 3(*b*), and 3(*c*).

Figure 4:
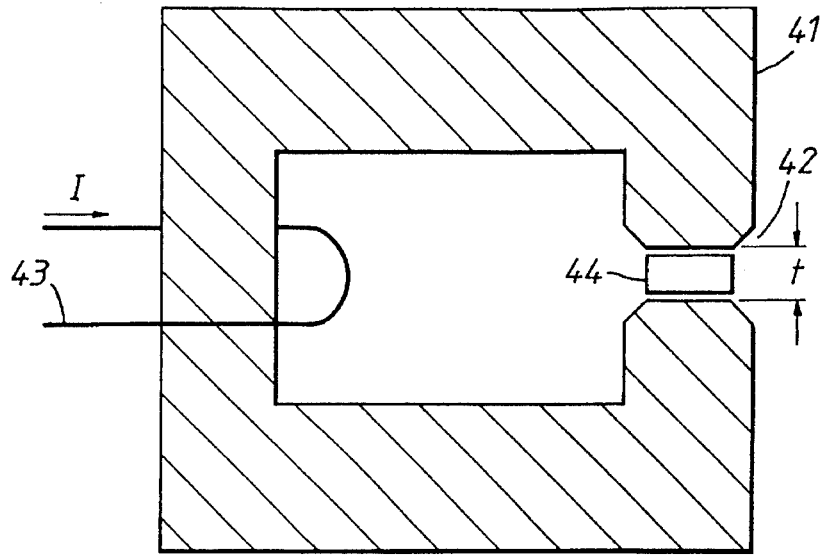
FIG. 4 is a view of a current detector including a Hall element.

FIG. 4 is a view of a current detector. The current detector comprises a yoke 41 of ferromagnetic material, e.g., Fe, FeNi alloys, ferrite or the like, having a gap 42. A wire 43 carrying an object current I is wound around yoke 41. A Hall element 44 is placed in gap 42 so as to detect a magnetic field.

If a Hall element in accordance with the present invention is used as Hall element 44, gap distance t can be almost the same as the thickness of the Hall element, i.e., gap distance t could be reduced in size. Therefore, since a magnetic field due to current I is formed in gap 42 in inverse proportion to gap distance t, a current detector having a good sensitivity can be provided by using a Hall element in accordance with the present invention as Hall element 44.

The Hall element of the present invention is also effective for increasing a current component parallel to the upper surface of semiconductor layer 13 (see the embodiment of FIGS. 3(*a*), 3(*b*), and 3(*c*)) given that first and second current supply portions 16, 17, 17' reach first insulator layer 12. Further, in this embodiment, current I can flow away from the upper surface of semiconductor layer 13, when a bias voltage is applied to gate electrode 21, so as to make a depletion layer at the upper surface of semiconductor layer 13. As a result, any offset voltage which may result from a piezo effect is reduced. The same thing is true if current flowing away from the upper surface of semiconductor layer 13 causes an inversion layer at the upper surface. An inversion layer under the gate insulator layer 20 is just as or nearly as effective as the aforementioned depletion layer, which depends on carriers, i.e., electrons or holes.

Also, in accordance with the present invention, current I can flow away from first trench 14, when a reverse bias voltage is applied to current path control portions 19, so as to make a depletion layer around current path control portions 19. This changes the length of the current path between first and second current supply portions 16, 17, 17'.

In the embodiment of FIG. 3(*a*), W substantially corresponds to the width of first current supply portion 16, and L substantially corresponds to the distance between first and second current supply portions 16, 17, 17'. Therefore, since the current path can be lengthened by only applying a reverse bias voltage to current path control portions 19, the ratio of L/W can be enlarged without enlarging the distance between first and second current supply portions 16, 17, 17'. Also, an insulated trench gate electrode could replace current path control portions 19. If a bias voltage is applied to this insulated trench gate electrode, so as to form a depletion layer in semiconductor layer 13 around this insulated trench gate electrode, this also can lengthen the current path.

Substrate 11 may be an n-type or p-type semiconductor in view of the provision of insulator layer 12. Further, if substrate 11 is an insulator, insulator layer 12 is not required. Also, semiconductor layer 13 of the first conductivity type, i.e., n-type, could be disposed directly on substrate 11 of the second conductivity type, i.e., p-type. However, substrate 11 providing an insulator surface, i.e., SOI structure, is preferable, since this would reduce the effect of the electric potential of substrate 11. Further, a similar effect would be achieved due to gate electrode 21 if semiconductor layer 13 provides a p-type semiconductor layer at a surface as a replacement for gate electrode 21 and second insulator layer 20. In other words, a p-type layer could be used to replace the structure including gate electrode 21 and second insulator 20.

Figure 5:
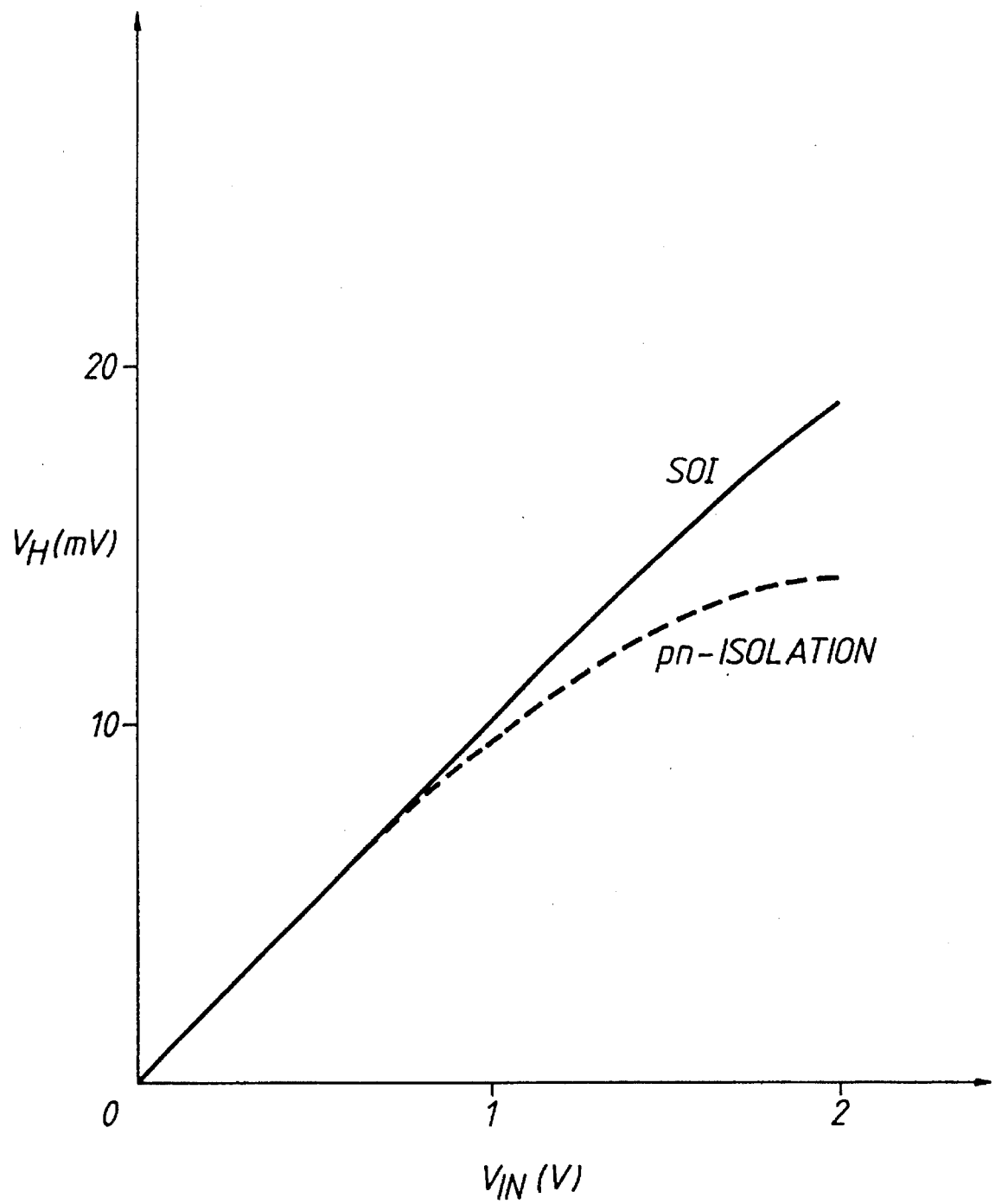
FIG. 5 is a graph showing a $V_{in}$-$V_H$ relation.

FIG. 5 shows a graph of a relation between $V_{in}$ and $V_H$ at B=1000 G. A continuous line shows a device using SOI, wherein the semiconductor layer has a thickness of 5 µm and Nd of $2 \times 10^{15} \text{cm}^{-3}$, and the thickness of the insulator layer 12 is 0.5 µm. A broken line shows a device using pn isolation without SOI. According to FIG. 5, the device with the SOI structure has good linearity.

EXAMPLE 2

Figure 6A:
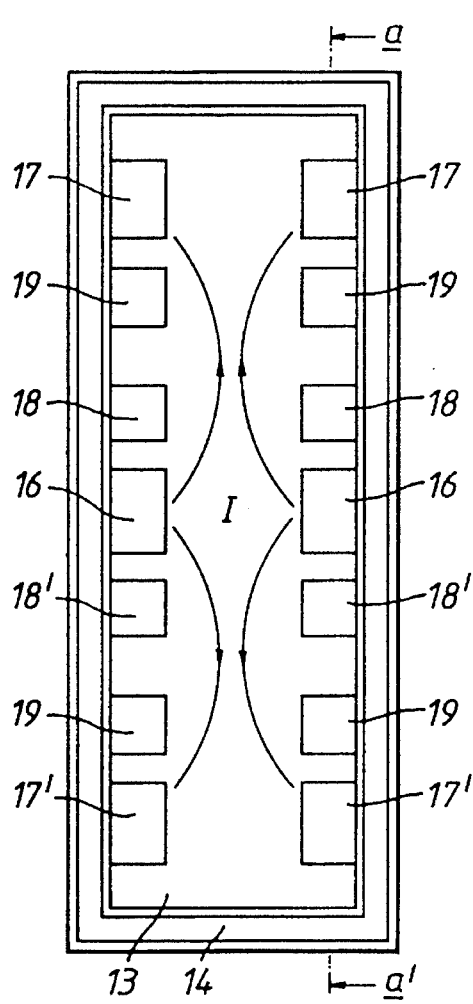
FIG. 6(a) is a plan view of a Hall element in accordance with another embodiment of the present invention.
Figure 6B:
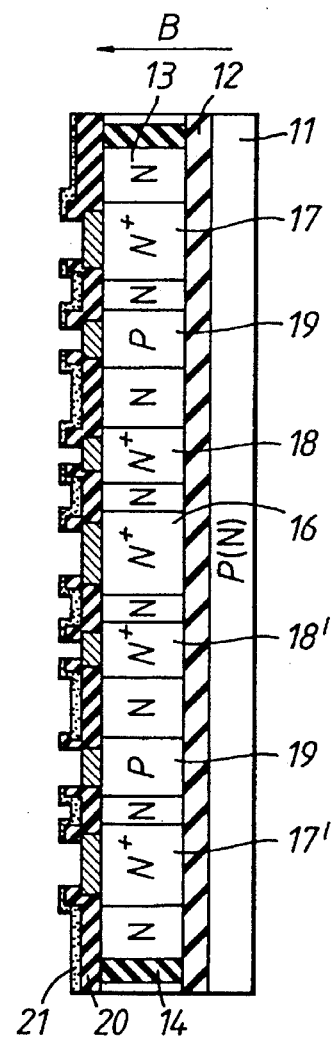
FIG. 6(b) is a sectional view of the Hall element depicted in FIG. 6(a)

This embodiment of the invention, depicted in FIGS. 6(*a*) and 6(*b*), is a variation of the embodiment discussed above in Example 1.

FIG. 6(*a*) is a plan view of a Hall element in accordance with another embodiment of the present invention. FIG. 6(*b*) is a sectional view of that Hall element taken along line a—a' of FIG. 6(*a*).

While the embodiment of Example 1 provides one set of first and second current supply portions 16, 17, 17' and sensor portions 18, 18' on one side of semiconductor layer 13 (i.e., at the left side of semiconductor layer 13), the embodiment of Example 2 provides two sets of these portions 16, 17, 17', 18, 18' on two opposing sides facing one another.

Also, in the embodiment of Example 2, current path control portions 19 are only placed between sensor portions and second current supply portions 18, 18', 17, 17'. However, current path control portions 19 could be placed between sensor portions and first current supply portions 18, 18', 16. The other details of the embodiment of Example 2 are the same as in the embodiment of Example 1.

When one set of portions 16, 17, 17', 18, 18' is provided in the manner shown in FIG. 3(*a*), an offset voltage may exist, if the placement of second current supply portions 17, 17' and sensor portions 18, 18' is such that these portions are not symmetrical with respect to the position of first current supply portion 16. However, since the embodiment in Example 2 provides two sets of portions 16, 17, 17', 18, 18' on opposing sides of semiconductor layer 13, any offset voltage that may have resulted from the placement of portions 16, 17, 17', 18, 18' is reduced.

In the embodiment of Example 2, detected Hall voltages can be used to cancel occurrences of offset voltage. In this regard, since a Hall voltage at one side of the semiconductor layer 13 is opposite that at the other side of semiconductor layer 13, any occurrences of offset voltage may be counterbalanced with each other. As a result, any offset voltage due to inaccurate mask placement during production of these portions 16, 17, 17', 18, 18', which is unavoidable, is reduced more than in Example 1. For example, when sensor portion 18 on one side of semiconductor layer 13 is connected to sensor portion 18' on the other side of semiconductor layer 13, an average Hall voltage between sensor portion 18' on the one side and sensor portion 18 on the other side would have a reduced offset voltage relative to that resulting from the structure found in Example 1.

EXAMPLE 3

This embodiment of the invention, depicted in FIGS. 7(*a*), 7(*b*), and 7(*c*), is also a variation of the embodiment discussed above in Example 1.

FIG. 7(*a*) is a plan view of a Hall element in accordance with yet another embodiment of the present invention. FIG. 7(*b*) is a sectional view taken along line a—a' of FIG. 7(*a*), and FIG. 7(*c*) is a sectional view taken along line b—b' of FIG. 7(*a*).

In Example 3, semiconductor layer 13 is divided into a first region 13₁ and a second region 13₂ by a second trench 15 filled with an insulator and located in a central portion of semiconductor layer 13. In each of first and second regions 13₁ and 13₂, first current supply portion 16, second current supply portions 17, 17', sensor portions 18, 18', and current path control portions 19, are formed adjacent to second trench 15 so as to be symmetrical with respect to second trench 15. The other details of the embodiment of Example 3 are the same as in the embodiment of Example 1. Even if the locations of sensor portions 18, 18' and second current supply portions 17, 17' are not completely symmetrical with respect to first current supply portion 16, any offset voltage of first region 13₁ would be opposite to any offset voltage of second region 13₂, with the result being that such offset voltages could counterbalance each other.

EXAMPLE 4

Figure 8A:
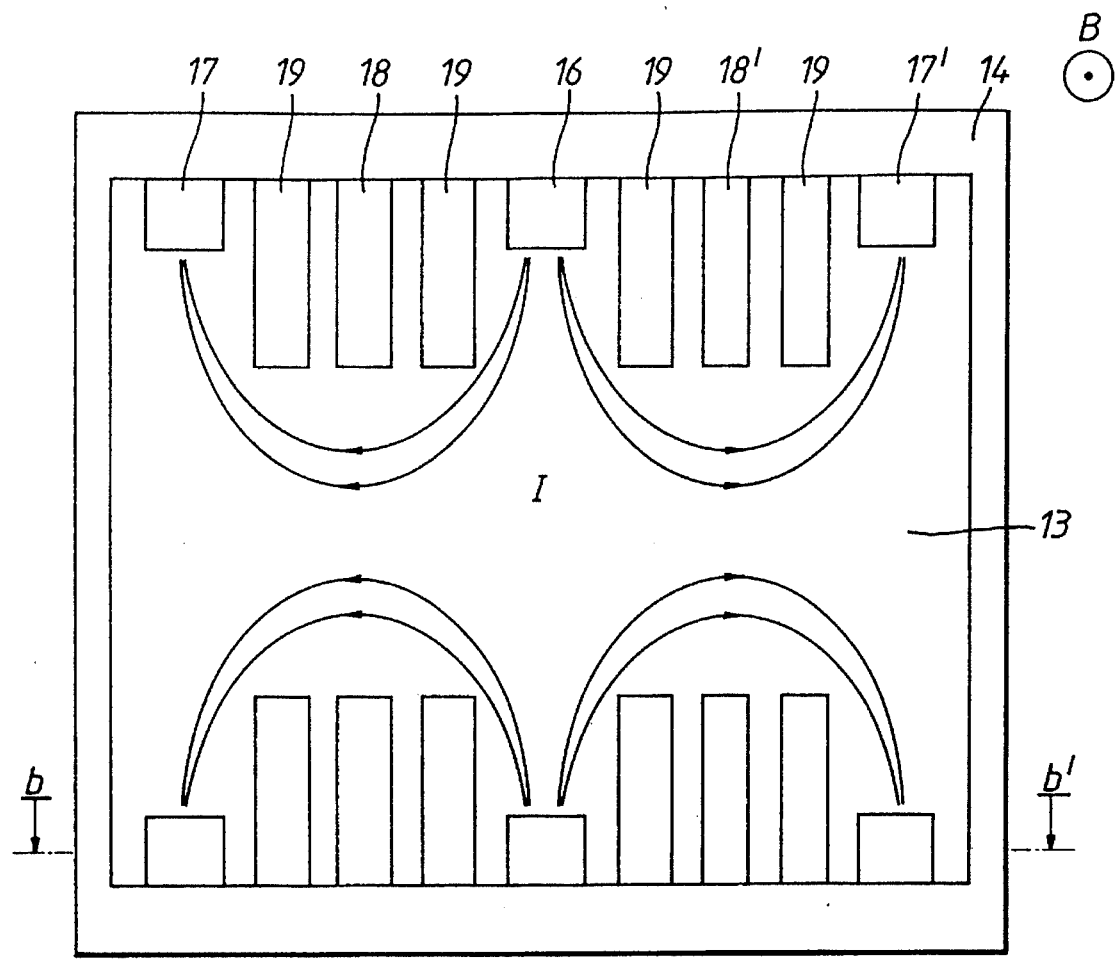
FIG. 8(a) is a plan view of a Hall element in accordance with still another embodiment of the present invention.
Figure 8B:
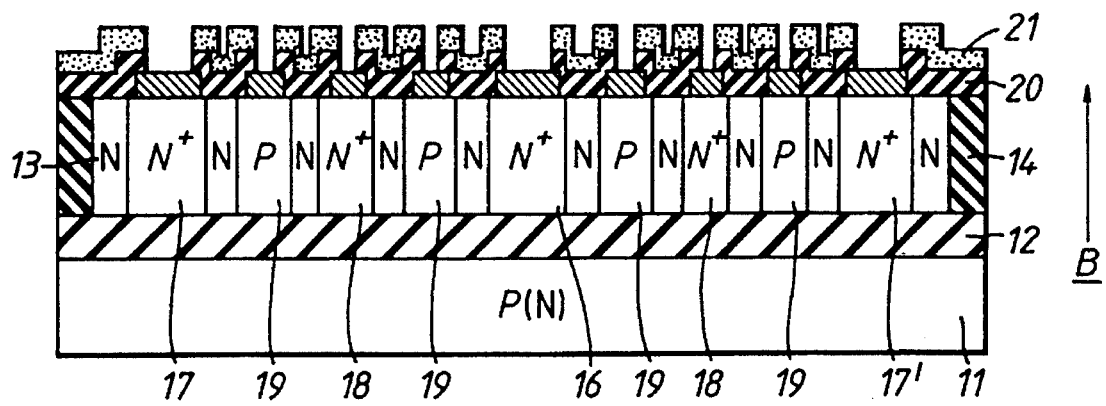
FIG. 8(b) is a sectional view of the Hall element depicted in FIG. 8(a)

FIG. 8(*a*) is a plan view of a Hall element in accordance with still another embodiment of the present invention. FIG. 8(*b*) is a sectional view taken along line b—b' of FIG. 8(*a*).

The embodiment of Example 4 provides two sets of portions 16, 17, 17', 18, 18' on two sides facing each other in the same manner as in the embodiment of Example 2. In the embodiment of Example 4, however, current path control portions 19 (or, alternatively, sensor portions 18, 18' as well as current path control portions 19 located on either side of such sensor portions) extend further toward a central portion of semiconductor layer 13 than first current supply portion 16 and second current supply portions 17, 17'. The other structures of the embodiment of Example 4 are the same as in the embodiment of Example 2. Since current path control portions 19 (or, alternatively, sensor portions 18, 18' as well as current path control portions 19) extend further toward to a central portion of semiconductor layer 13, the current path is longer than that in Example 2.

EXAMPLE 5

Figure 9A:
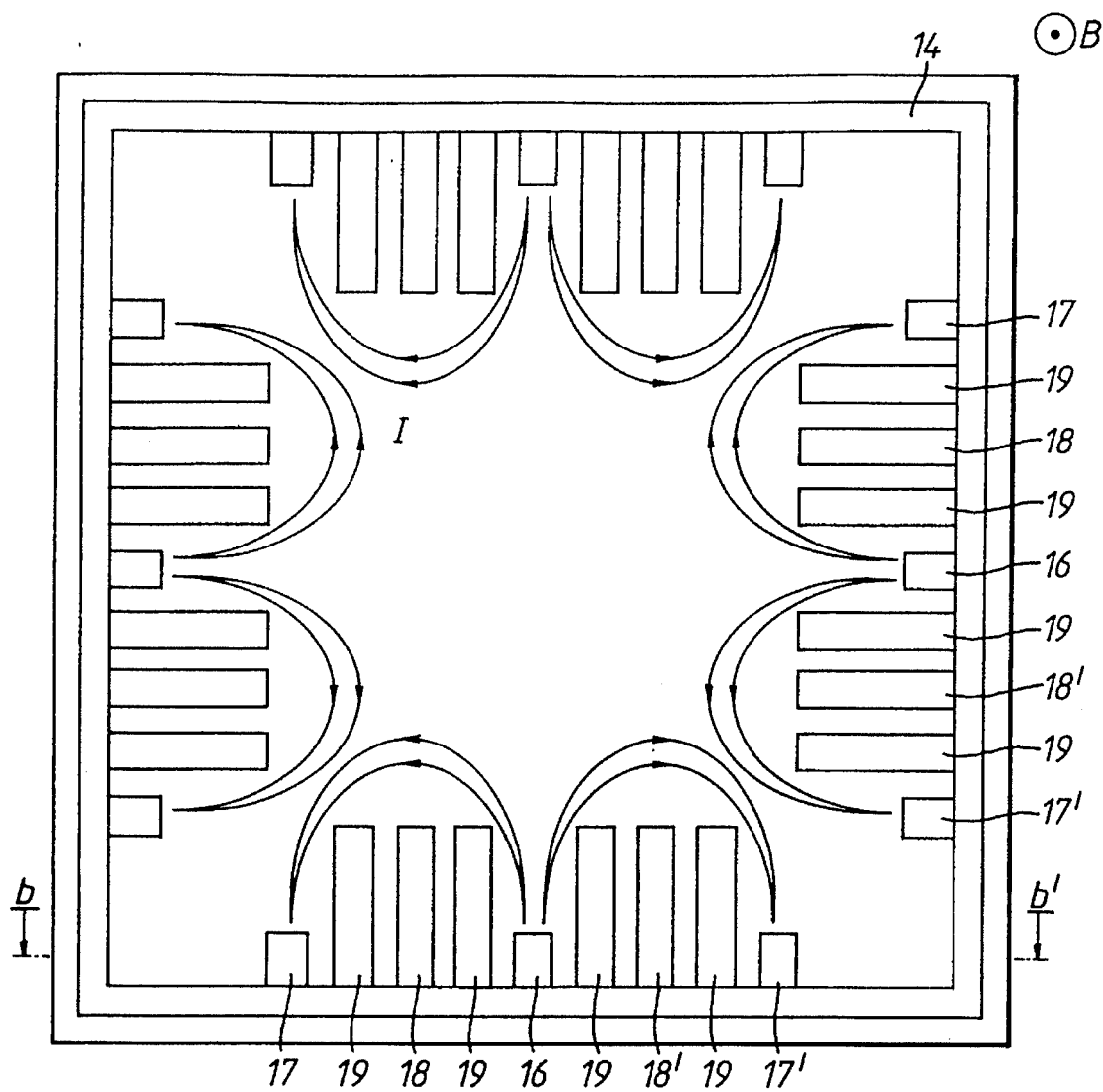
FIG. 9(a) is a plan view of a Hall element in accordance with yet another embodiment of the present invention.
Figure 9B:
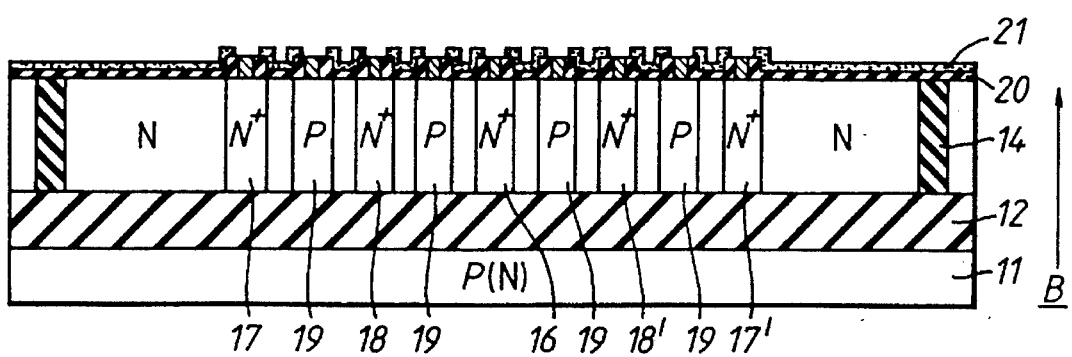
FIG. 9(b) is a sectional view of the Hall element depicted in FIG. 9(a)

FIG. 9(*a*) is a plan view of a Hall element in accordance with yet another embodiment of the present invention. FIG. 9(*b*) is a sectional view taken along line b—b' of FIG. 9(*a*).

The embodiment of Example 5 provides two structures according to Example 4, i.e., each of the four sides of semiconductor layer 13 provides first and second current supply portions 16, 17, 17', sensor portions 18, 18', and current path control portions 19, respectively. The other structures of the embodiment of Example 5 are the same as in the embodiment of Example 4.

The embodiment of Example 5 has a 90° period symmetrical placement of portions 16, 17, 17', 18, 18'. This arrangement is effective to reduce offset voltage due to piezoresistance. In this regard, piezoresistance may change according to crystal direction. For example, piezoresistances may change at a 900 period in the <100> plane of Si.

Therefore, in the embodiment of Example 5, when a semiconductor layer having a 900 period change of piezoresistances is used, the offset voltage induced at one side of semiconductor layer 13 is opposite the offset voltage induced at another side facing the one side. As a result, the offset voltages due to the piezo effect act to counterbalance each other.

EXAMPLE 6

Figure 10A:
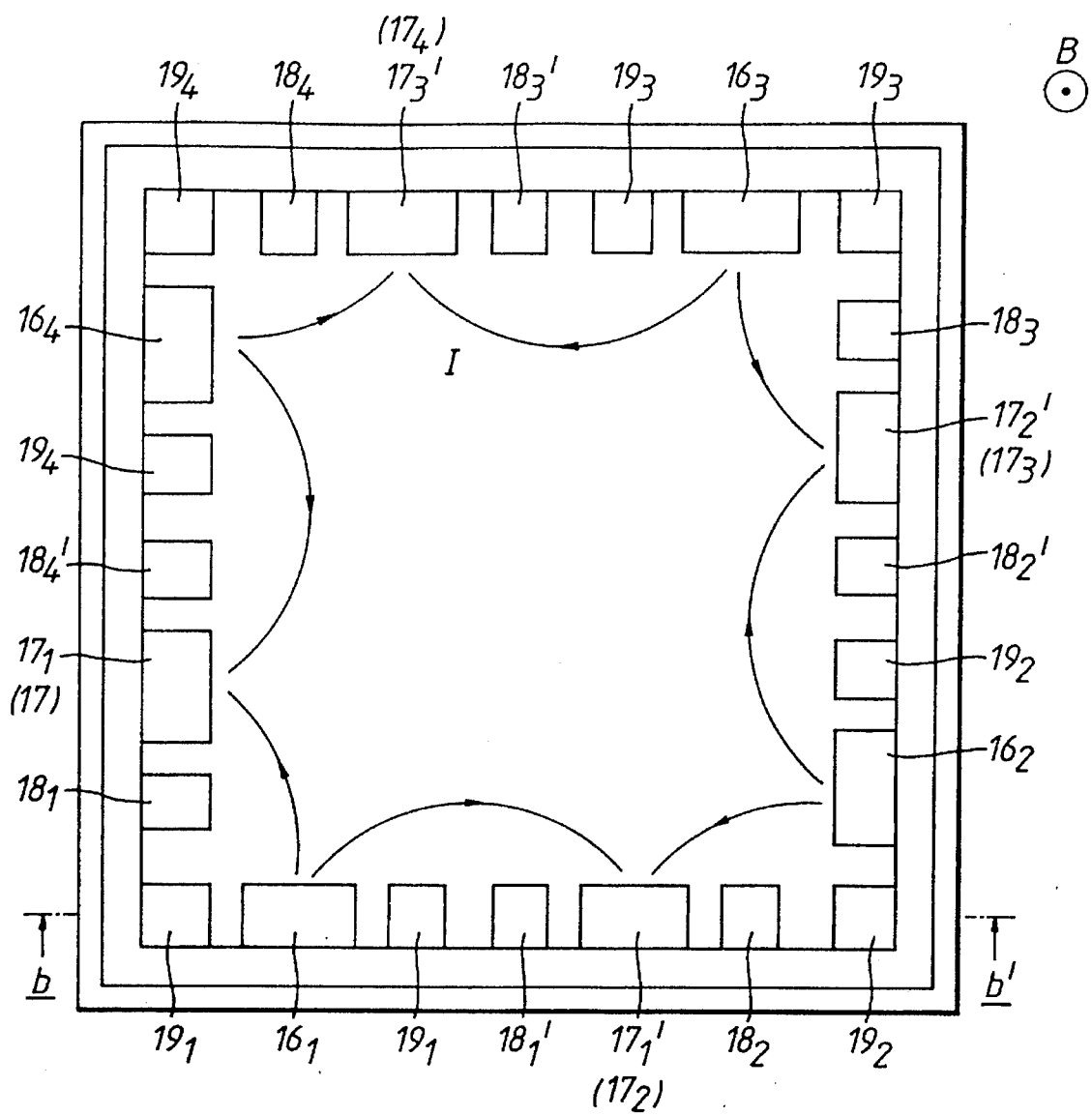
FIG. 10(a) is a plan view of a Hall element in accordance with still another embodiment of the present invention.
Figure 10B:
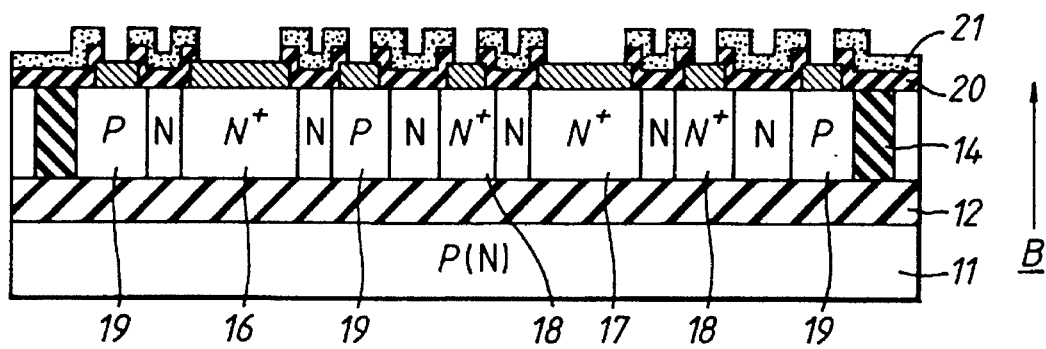
FIG. 10(b) is a sectional view of the Hall element depicted in FIG. 10(a)

FIG. 10(a) is a plan view of a Hall element in accordance with still another embodiment of the present invention. FIG. 10(b) is a sectional view taken along line b—b' of FIG. 10(a).

In previous examples, first and second current supply portions 16, 17, 17', sensor portions 18, 18', and current path control portions 19 were arranged on one side of semiconductor layer 13. However, these portions may be separated between one side and a neighboring side of semiconductor layer 13, as illustrated in FIGS. 10(a) and 10(b).

With reference to FIGS. 10(a) and 10(b), in the embodiment of Example 6, first current supply portion $16_1$, second current supply portions $17_1$, $17'_1$, sensor portions $18_1$, $18'_1$, and current path control portions $19_1$, compose one set. First current supply portions $16_2$, $16_3$, $16_4$, second current supply portions $17_2$, $17_3$, $17_4$, $17'_2$, $17'_3$, $17'_4$, sensor portions $18_2$, $18_3$, $18_4$, $18'_2$, $18'_3$, $18'_4$, and current path control portions $19_2$, $19_3$, $19_4$, also compose one set, respectively.

First current supply portions $16_1$, $16_2$, $16_3$, $16_4$ and second current supply portions $17'_1$, $17'_2$, $17'_3$, $17'_4$, are positioned along one side of semiconductor layer 13, respectively. Sensor portions $18'_1$, $18'_2$, $18'_3$, $18'_4$ are positioned along the one side between first current supply portions $16_1$, $16_2$, $16_3$, $16_4$, and second current supply portions $17'_1$, $17'_2$, $17'_3$, $17'_4$, respectively.

Second current supply portions $17_1$, $17_2$, $17_3$, $17_4$ are placed along the left side of the one side of semiconductor layer 13. Sensor portions $18_1$, $18_2$, $18_3$, $18_4$ are placed along the left side and between first current supply portions $16_1$, $16_2$, $16_3$, $16_4$ and second current supply portions $17_1$, $17_2$, $17_3$, $17_4$.

As a result of the aforementioned arrangement, second current supply portions $17'_1$, $17'_2$, $17'_3$, $17'_4$ fill the role of second current supply portions $17_2$, $17_3$, $17_4$, and $17_1$, respectively. These portions are positioned with rotational symmetry with respect to the center of semiconductor layer 13 at a 90° period. This embodiment could be also be used to reduce offset voltage due to the piezo effect.

EXAMPLE 7

The above Examples 1 through 6 describe Hall elements which perform the function of detecting a Hall voltage. However, there is another type of a Hall element which performs the function of detecting a Hall current. A constant current power supply is used in this type of Hall element, while a constant voltage power source is used in the type of Hall element detecting a Hall voltage. In the Hall element detecting a Hall current, the inclusion of a structure wherein a current can flow in parallel with respect to a plane of semiconductor layer is useful.

Figure 11A:
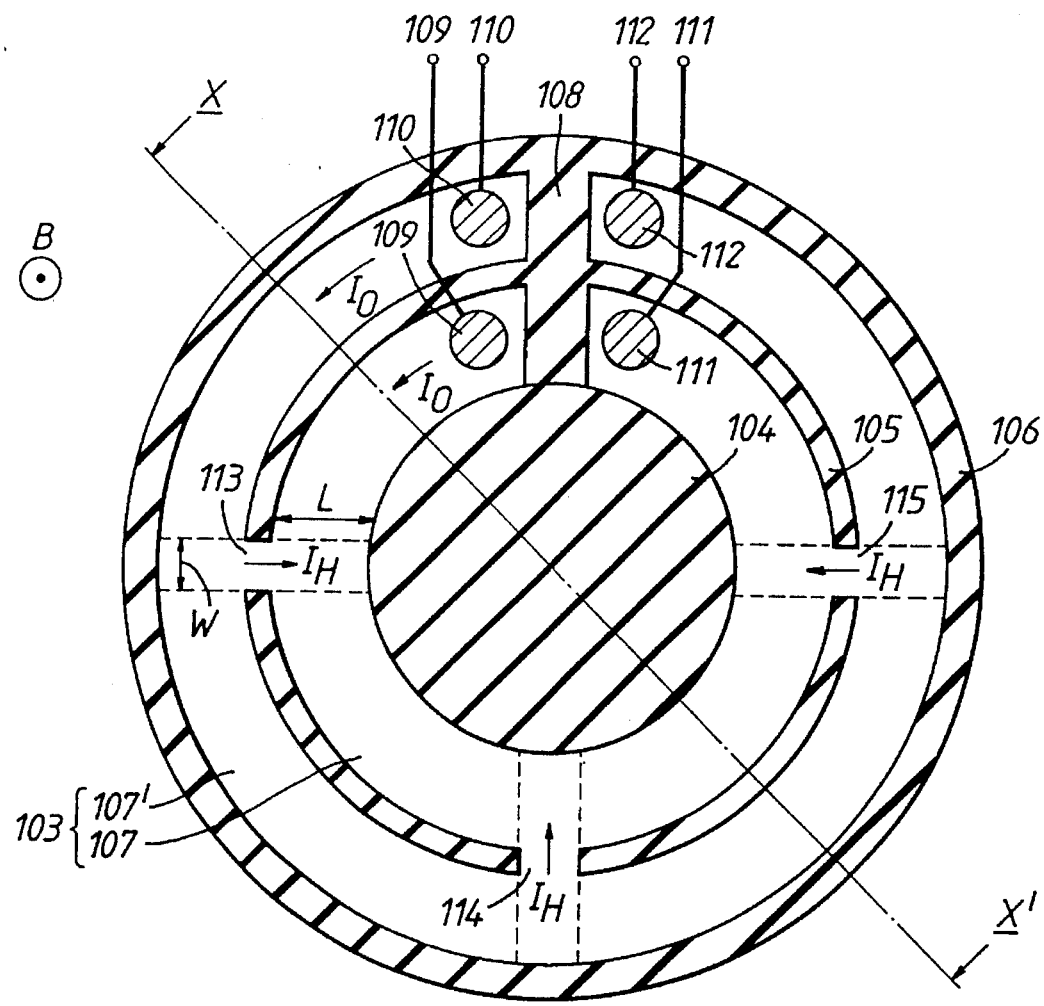
FIG. 11(a) is a plan view of a Hall element in accordance with yet another embodiment of the present invention.
Figure 11B:
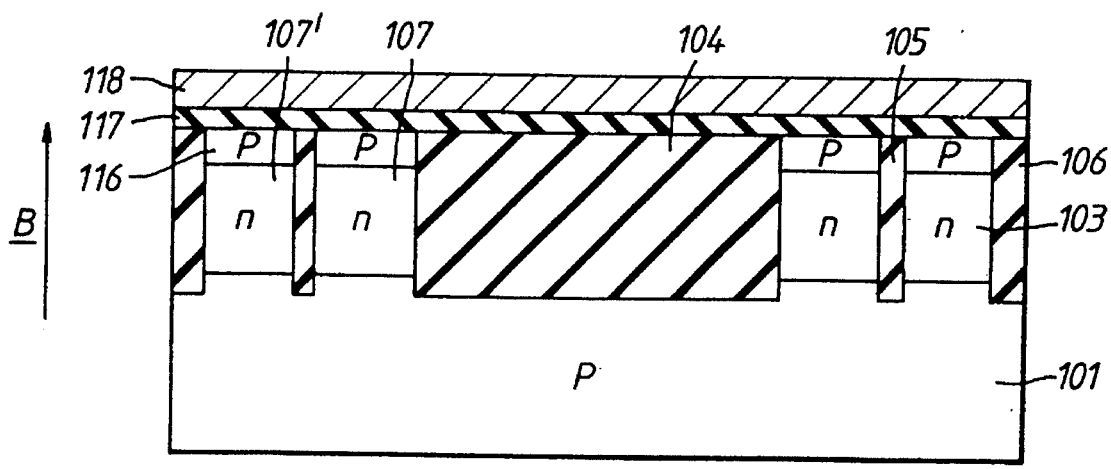
FIG. 11(b) is a sectional view of the Hall element depicted in FIG. 11(a)

Example 7 relates to the subject matter depicted in FIGS. 11(a) and 11(b). FIG. 11(a) is a plan view of a Hall element in accordance with yet another embodiment of the present invention. FIG. 11(b) is a sectional view taken along line x—x' of FIG. 11(a).

In this embodiment of Example 7, a semiconductor layer 103 of an n-type semiconductor is formed on a substrate 101 of a p-type semiconductor. Semiconductor layer 103 provides a first trench 104, a second trench 105, and a third trench 106, each filled with insulator, respectively. Trenches 104, 105, and 106 reach substrate 101.

First trench 104 is round and surrounded by second trench 105 having a circular shape. Further, second trench 105 is surrounded by third trench 106 having a circular shape. As a result, semiconductor layer 103 is divided into a first circular portion 107 (first current path) placed between first and second trenches 104, 105, and a second circular portion 107' (second current path) placed between second and third trenches 105, 106. First and second circular portions 107, 107' are electrically separated by first and second trenches 105, 106, and substrate 101.

Semiconductor layer 103 provides a fourth trench 108 filled with insulator so as to intersect first and second circular portions 107, 107'. Fourth trench 108 also reaches substrate 101.

A first electrode 109 and a third electrode 111 are placed on first circular portion 107 with fourth trench 108 between them. A second electrode 110 and a fourth electrode 112 are also placed on second circular portion 107' with fourth trench 108 between them. Semiconductor layer 103 may provide highly doped semiconductor regions under these electrodes to ensure good ohmic contact. The highly doped semiconductor regions preferably reach substrate 101.

Second trench 105 provides first, second and third holes 113, 114, and 115, respectively. Second hole 114 faces fourth trench 108 across first trench 104. First and third holes 113, 115 face each other across first trench 104. Holes 113, 114, 115 and fourth trench 108 are set apart by about 90° in a rotational direction.

A p-type semiconductor layer 116 is formed on semiconductor layer 103 except for the regions under first, second, third and fourth electrodes 109, 110, 111,112. Further, an insulator layer 117 is formed on p-type semiconductor layer 116 and a gate electrode 118 is formed on insulator layer 117.

Figure 12:
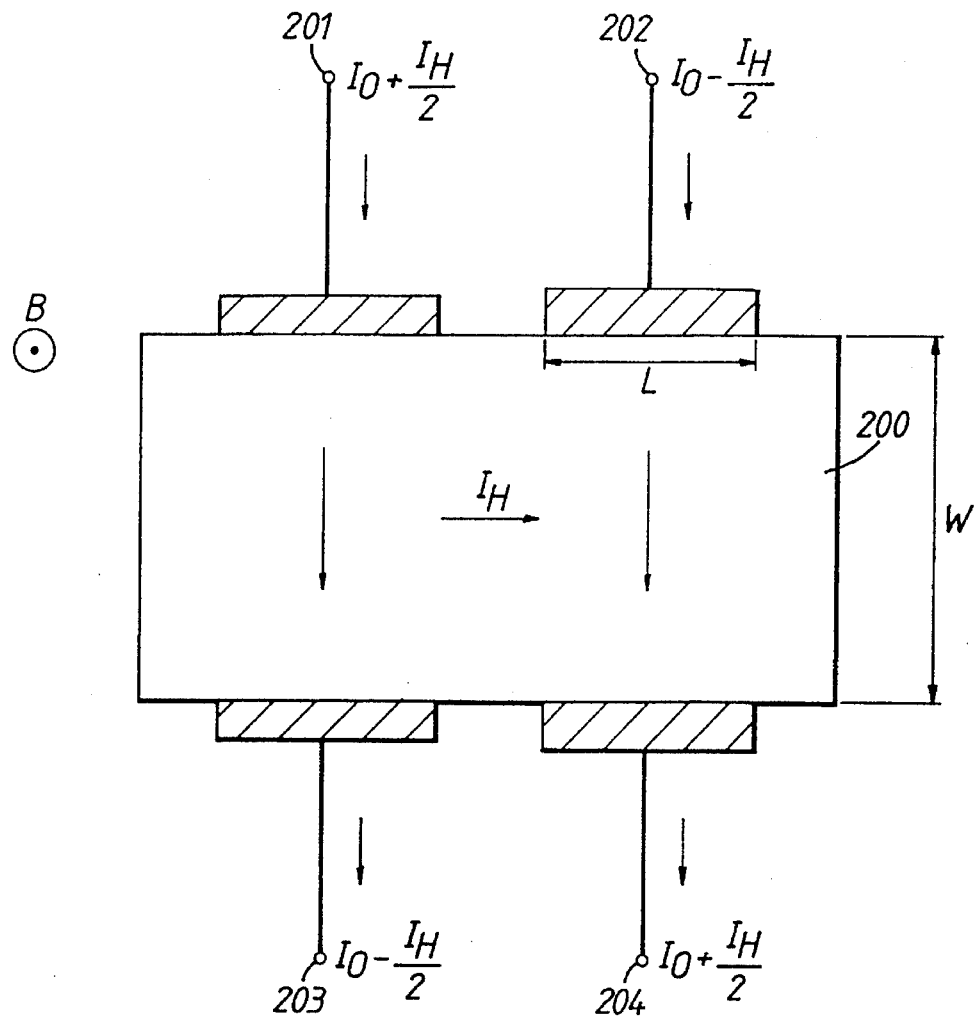
FIG. 12 is a view of a Hall element.

FIG. 12 is a view of a Hall element for detecting a Hall current. A first electrode 201 and a second electrode 202 are placed on one side of an n-type semiconductor layer 200 having a thickness W. First electrode 201 is placed at the left side of second electrode 202. A third electrode 203 and a fourth electrode 204 are placed on another side of n-type semiconductor layer 200 so as to face first and second electrodes 201 and 202, respectively. Each electrode 201, 202, 203, 204 has a width L.

An initial current $I_o$ flows from first and second electrodes 201,202 to third and fourth electrodes 203,204. When a magnetic field B is applied in a perpendicular direction from the back to the front of FIG. 12, a Hall current $I_H$ will be induced in a direction from the left to the right in FIG. 12. As a result, a current at third electrode 203 will be $I_o-(I_H/2)$, and a current at fourth electrode 204 will be $I_o+(I_H/2)$, while a current at first electrode 201 will be $I_o+(I_H/2)$, and a current at second electrode 202 will be $I_o-(I_H/2)$. If a p-type semiconductor layer is substituted for n-type semiconductor layer 200, or a reverse magnetic field B is applied, then a Hall current $I_H$ will be induced in the direction from the right to the left in FIG. 12.

The current difference between third electrode 203 and fourth electrode 204 in the case where a magnetic field is applied, or between first and second electrodes 201,202 in the case where a magnetic field is applied, is compared to an initial current difference between such electrodes, i.e., a current difference in the case where a magnetic field is not applied. This variation from the initial current difference is in proportion to a magnitude of magnetic flux B. As a result, the magnitude of the magnetic field can be detected. In this type of a Hall element, since the current difference is compared to the initial current difference, an offset voltage due to the position of electrodes 201, 202, 203, 204 will not exist.

A Hall current $I_H$ is represented by the following formula:

$$I_H = \mu_H \times W/L \times G \times 2I_o \times B_{vertical}$$

where $\mu_H$ is a Hall mobility, W is the distance between first and third electrodes 201, 203, i.e., a width of semiconductor layer 200, L is the width of an electrode, $I_o$ is an initial current, and $B_{vertical}$ is a magnetic field component in a vertical direction of the semiconductor layer. Further, G (0<G<1) is a form factor and a function of W/L which is saturated as W/L increases.

For increasing sensitivity of a Hall element, i.e., to obtain a larger current $I_H$, G is preferably as large as possible. Therefore, it is preferable that L>3W. However, a large L may reduce $I_H$ due to the inclusion of the term W/L in the above formula. As a result, W would have to become larger to obtain a sufficient sensitivity.

Concerning the Hall element shown in FIGS. 11(a) and 11(b), a current can flow from first and second electrodes 109, 110 to third and fourth electrodes 111, 112. When magnetic flux B exists in a perpendicular direction with respect to a plane of semiconductor layer 103, a Hall current $I_H$ will be induced at each of first, second, and third holes 113, 114, 115.

W in FIG. 12 corresponds to the width of each hole 113, 114, 115 in FIG. 11, and L in FIG. 12 corresponds to the width of each of circular portions 107, 107' in FIG. 11. Therefore, if W becomes larger, the size of the Hall element does not necessarily become large.

Further, the current difference between third electrode 111 ($I_3$) and fourth electrode 112 ($I_4$) will be about $3 \times i_H$. As a result, good sensitivity can be obtained without enlargement of the element size.

Moreover, the current difference between 13 and 14 in the case where magnetic flux is applied will be compared to an initial current difference between $I_3$ and $I_4$. As a result, magnetic flux can be detected.

In this Hall element, since the current difference between $I_3$ and $I_4$ (or between $I_1$ and $I_2$) in the case where magnetic flux is applied will be compared to an initial current difference between $I_3$ and $I_4$ (or between $I_1$ and $I_2$), an offset voltage due to the position of electrodes 109, 110, 111, 112 does not exist. Further, the current can be adjusted by providing electrical resistance, such as a resistor or a MOS. Moreover, since this embodiment provides p-type semiconductor layer 116, current can flow away from the upper surface of semiconductor layer 103. As a result, offset voltage due to the piezo effect can be reduced. Furthermore, when a bias voltage is applied to gate electrode 118 so as to make a depletion layer at the upper surface of semiconductor layer 103, current can flow away from the upper surface of semiconductor layer 103. As a result, influences due to piezo effect are reduced to an even greater degree.

EXAMPLE 8

Figure 13:
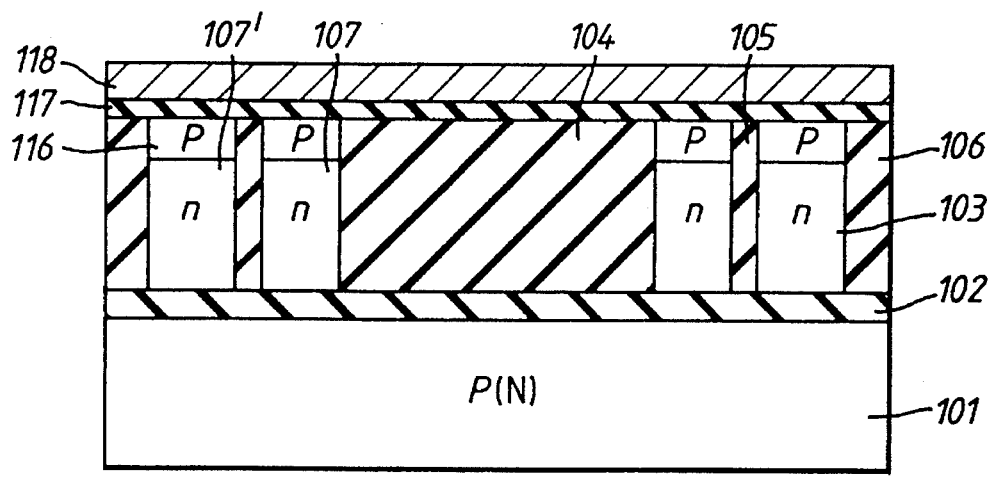
FIG. 13 is a sectional view of a Hall element in accordance with still another embodiment of the present invention.

In the Hall element shown in FIG. 11(b), semiconductor layer 103 is formed directly on substrate 101. However, a buried insulator layer 102 may be disposed between semiconductor layer 103 and substrate 101 as shown in FIG. 13. More particularly, FIG. 13 is a cross-sectional view of a Hall element according to the present invention. Except for providing buried insulator layer 102, the structure of the Hall element in FIG. 12 is the same as that in FIGS. 11(a) and 11(b).

In the Hall element shown in FIG. 13, since first and second circular portions 107, 107' are electrically separated by buried insulator layer 102, substrate 101 is not required to be a p-type semiconductor, i.e., substrate 101 may be an n-type semiconductor. Further, if substrate 101 is an insulator, buried insulator layer 102 is not necessary.

EXAMPLE 9

Figure 14:
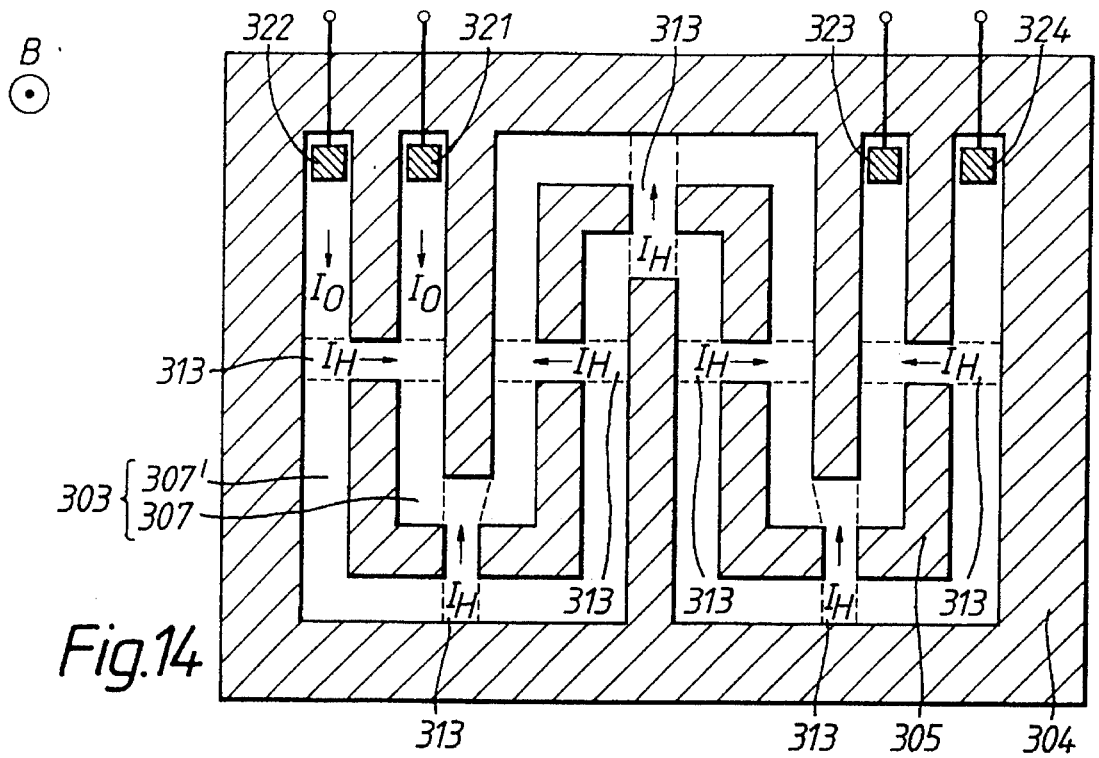
FIG. 14 is a plan view of a Hall element in accordance with yet another embodiment of the present invention.

In Example 7, first and second circular portions 107, 107' are provided. However, it is not necessary for the separated portions to be circular. FIG. 14 is a plan view of a Hall element in accordance with yet another embodiment of the present invention illustrating this point.

In FIG. 14, a semiconductor layer 303 is surrounded by an interdigital trench 304 filled with an insulator so that semiconductor layer 303 has a zigzag shape. Semiconductor layer 303 is divided into first and second current paths 307, 307' by a zigzag trench 305 filled with an insulator. Current paths 307, 307' are parallel with respect to each other and bent at a 90° angle several times. Zigzag trench 305 provides several holes 313 so that current can flow between current path portions 307, 307'.

A first electrode 321 is placed at one end of first current path 307, and a third electrode 323 is placed at the other end of first current path 307. In the same way, a second electrode 322 and a fourth electrode 324 are placed at each end of second current path 307', respectively.

When magnetic flux B exists in a perpendicular direction with respect to a plane of semiconductor layer 303, Hall current $I_H$ will be induced at each hole couple 313. As a result, good sensitivity can be obtained without any enlargement of element size.

EXAMPLE 10

Figure 15:
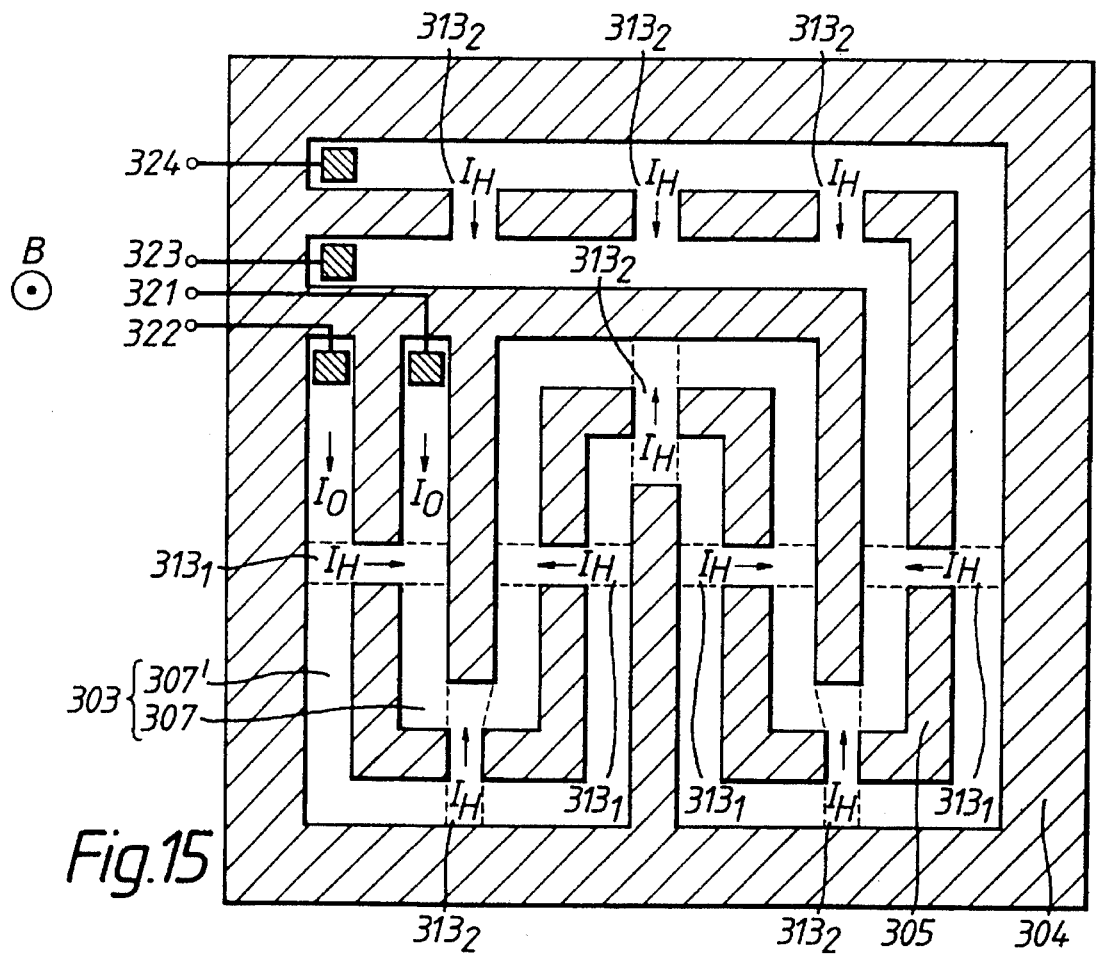
FIG. 15 is a plan view of a Hall element in accordance with still another embodiment of the present invention.

FIG. 15 is a plan view of a Hall element in accordance with yet another embodiment of the present invention. The embodiment of FIG. 15, corresponding to Example 10, is a variation on the embodiment of Example 9.

The Hall element of Example 10 provides the same number of hole couples as are provided in Example 9. In Example 10, for example, two pairs of hole couples $313_1$ and three pairs of hole couples $313_2$ are provided, and with each pair of hole couples, the Hall current $I_H$ in the first hole couple is 180° different than that of the Hall current of the second hole couple. Moreover, the $I_H$ direction of each hole couple $313_1$ is 90° different than the $I_H$ direction of each hole couple $313_2$.

As described above, piezoresistances may change at a 90° period in the <100> plane of Si. Therefore, the Hall element of Example 10 can counterbalance any offset voltage that may result from the piezo effect.

All of the examples of the embodiments discussed above in connection with the present invention are planar type semiconductor devices, because all electrodes may be placed on one surface of each of those devices. Therefore, in accordance with the present invention, the gap distance t provided in a yoke of a current detector may be almost the same as the thickness of a Hall element. As a result, the gap distance t can be reduced and a current detector having a good sensitivity can be provided.

Further, a Hall element in accordance with the present invention can be composed of two or more of the above-mentioned embodiments. For example, a Hall element in accordance with the present invention may be composed using a combination of a first structure configured in accordance with Example 1 and a second structure configured in accordance with Example 3 or, alternatively, a combination of a first structure configured in accordance with Example 1 and a second structure configured in accordance with Example 1.

It will be apparent to those skilled in the art that various modifications and variations can be made in the Hall element of the present invention without departing from the spirit or scope of the invention. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A Hall element comprising:
    a semiconductor layer of a first conductivity type having an upper surface and a side surface;
    an insulator portion having a side surface adjacent the side surface of the semiconductor layer;
    a first current supply portion of the first conductivity type disposed adjacent the side surface of the insulator portion;
    a pair of second current supply portions of the first conductivity type disposed adjacent the side surface of the insulator portion; and
    a pair of sensor portions of the first conductivity type disposed adjacent the side surface of the insulator portion, wherein the first current supply portion is disposed between the sensor portions, the first current supply portion and the sensor portions are disposed between the second current supply portions, and the Hall element comprises means for inducing a Hall voltage between the sensor portions with magnetic flux perpendicular to the upper surface of the semiconductor layer during current flowing between the first and second current supply portions along a current path.

2. The Hall element according to claim 1, further comprising an insulator layer disposed below the semiconductor layer and in contact with the insulator portion.

3. The Hall element according to claim 2, wherein the first and second current supply portions and the sensor portions abut the insulator layer.

4. The Hall element according to claim 1, further comprising:
    a gate insulator layer disposed on the upper surface of the semiconductor layer;
    a gate electrode disposed on the gate insulator layer; and
    at least one of a depletion layer, an accumulation layer, and an inversion layer formed under the gate insulator layer when a bias voltage is applied to the gate electrode so that current between the first and second current supply portions can flow away from the upper surface of the semiconductor layer.

5. The Hall element according to claim 1, wherein the semiconductor layer is disposed between two sections of the insulator portion, and each section of the insulator portion is associated with a set of components including the first current supply portion, the second current supply portions, and the sensor portions.

6. The Hall element according to claim 5, wherein the semiconductor layer is surrounded by the insulator portion, the insulator portion has two sets of facing sides, and each set of facing sides is associated with a set of components including a first current supply portion, a pair of second current supply portions, and a pair of sensor portions.

7. The Hall element according to claim 6, wherein, for each set of facing sides, the first current supply portion, the second current supply portions, and the sensor portions are arranged substantially symmetrical with respect to a center of the semiconductor layer at a 90° period.

8. The Hall element according to claim 1, wherein the semiconductor layer is divided by the insulator portion into a first region and a second region, and each region is associated with a set of components including a first current supply portion, a pair of second current supply portions, and a pair of sensor portions.

9. The Hall element according to claim 8, wherein, for each set associated with one of the regions of the semiconductor layer, the first current supply portion, the second current supply portions, and the sensor portions are arranged substantially symmetrical with respect to the insulator portion.

10. The Hall element according to claim 1, further comprising current path control means for lengthening the current path between the first and second current supply portions.

11. The Hall element according to claim 10, wherein the current path control means comprises a current path control portion of a second conductivity type disposed between the first and second current supply portions and allowing application of a reverse voltage between the semiconductor layer and the current path control portion.

12. The Hall element according to claim 11, wherein the current path control portion is distanced from the insulator portion further than the first and second current supply portions are distanced from the insulator portion.

13. The Hall element according to claim 11, further comprising an insulator layer disposed below the semiconductor layer and in contact with the insulator portion.

14. The Hall element according to claim 10, wherein the current path control means comprises a current path control portion of an insulated gate electrode disposed in the semiconductor layer between the first and second current supply portions and configured so that the current path between the first and second current supply portions is lengthened by forming one of a depletion layer, an accumulation layer and an inversion layer surrounding the insulated gate electrode when a bias voltage is applied to the insulated gate electrode.

15. The Hall element according to claim 1, wherein the semiconductor layer is formed on a substrate having an insulator surface.

16. The Hall element according to claim 1, wherein the semiconductor layer is formed on a semiconductor substrate of a second conductivity type.

17. The Hall element according to claim 1, further comprising a second conductivity type semiconductor layer disposed on the semiconductor layer of the first conductivity type.

18. A Hall element comprising:
    a semiconductor layer of a first conductivity type having an upper surface; and
    an insulator portion dividing the semiconductor layer into first and second current paths and providing a Hall current path between the first and second current paths, wherein the first and second current paths are substantially parallel with respect to one another so that a Hall current flows between the first and second current paths through the Hall current path when magnetic flux exists in a direction perpendicular to the upper surface of the semiconductor layer during current flowing along the first and second current paths.

19. A Hall element comprising:

a semiconductor layer of a first conductivity type having an upper surface and a side surface;

an insulator portion having a side surface adjacent the side surface of the semiconductor layer;

a first current supply portion of the first conductivity type disposed adjacent the side surface of the insulator portion;

a pair of second current supply portions of the first conductivity type disposed adjacent the side surface of the insulator portion so that a current between the first and second current supply portions has a current component perpendicular to a plane composed of an interface between the insulator portion and the semiconductor layer; and a pair of sensor portions of the first conductivity type disposed adjacent the side surface of the insulator portion so that a Hall voltage is induced between the sensor portions with magnetic flux perpendicular to the upper surface of the semiconductor layer during current flowing between the first and second current supply portions.

20. A Hall element of a planar type semiconductor device comprising:

a substrate including an insulator surface;

a semiconductor layer of a first conductivity type disposed on the insulator surface of the substrate and having an upper surface and a side surface;

first and second current supply portions of the first conductivity type disposed adjacent the side surface of the semiconductor layer so that current can flow between the first and second current supply portions; and sensor portions of the first conductivity type disposed adjacent the side surface of the semiconductor layer so that a Hall voltage due to magnetic flux perpendicular to the upper surface of the semiconductor layer can be induced between the sensor portions.

21. The Hall element according to claim 20, wherein the first and second current supply portions are disposed so that current between first and second current supply portions has a current component perpendicular to a surface including the first and second current supply portions.

22. A current detector comprising:

a magnetic yoke having a gap;

a wire carrying an object current and winding around the magnetic yoke; and a Hall element including a semiconductor layer of a first conductivity type having an upper surface and a side surface, an insulator portion having a side surface adjacent the side surface of the semiconductor layer, a first current supply portion of the first conductivity type disposed adjacent the side surface of the insulator portion, a pair of second current supply portions of the first conductivity type disposed adjacent the side surface of the insulator portion, and a pair of sensor portions of the first conductivity type disposed adjacent the side surface of the insulator portion, wherein the first current supply portion is disposed between the sensor portions, the first current supply portion and the sensor portions are disposed between the second current supply portions, and the Hall element comprises means for inducing a Hall voltage between the sensor portions with magnetic flux perpendicular to the upper surface of the semiconductor layer during current flowing between the first and second current supply portions along a current path.

23. A current detector comprising:

a magnetic yoke having a gap;

a wire carrying an object current and winding around the magnetic yoke; and a Hall element including a substrate including an insulator surface, a semiconductor layer of a first conductivity type disposed on the insulator surface of the substrate and having an upper surface and a side surface, first and second current supply portions of the first conductivity type disposed adjacent the side surface of the semiconductor layer so that current can flow between the first and second current supply portions, and sensor portions of the first conductivity type disposed adjacent the side surface of the semiconductor layer so that a Hall voltage due to magnetic flux perpendicular to the upper surface of the semiconductor layer can be induced between the sensor portions.

* * * * *